United States Patent
Lai et al.

(10) Patent No.: US 7,289,556 B2
(45) Date of Patent: Oct. 30, 2007

(54) APPARATUS AND METHOD FOR COMPENSATING SIGNAL ATTENUATION BASED ON AN EQUALIZER

(75) Inventors: Jyh-Ting Lai, Hsinchu (TW); Shih-ming Yu, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 10/063,276

(22) Filed: Apr. 8, 2002

(65) Prior Publication Data

US 2006/0126715 A1    Jun. 15, 2006

(51) Int. Cl.
*H03H 7/30* (2006.01)

(52) U.S. Cl. .................. 375/232; 375/317; 375/345; 375/233; 375/350; 342/367; 702/117

(58) Field of Classification Search .......... 375/321, 375/350, 347, 233, 232, 345; 342/367; 702/117

See application file for complete search history.

(56) References Cited

U.S. PATENT DOCUMENTS

| | | | | |
|---|---|---|---|---|
| 5,349,609 A | * | 9/1994 | Tsujimoto | 375/347 |
| 5,880,645 A | * | 3/1999 | Everitt et al. | 333/18 |
| 6,593,880 B2 | * | 7/2003 | Velazquez et al. | 342/367 |
| 6,643,334 B1 | * | 11/2003 | Limberg | 375/321 |
| 6,694,280 B2 | * | 2/2004 | Lai | 702/117 |
| 6,751,255 B1 | * | 6/2004 | Reuven et al. | 375/233 |
| 2003/0219085 A1 | * | 11/2003 | Endres et al. | 375/350 |

* cited by examiner

*Primary Examiner*—Chieh M. Fan
*Assistant Examiner*—Sudhanshu C. Pathak
(74) *Attorney, Agent, or Firm*—Winston Hsu

(57) ABSTRACT

An apparatus and a method for compensating signal attenuation based on an equalizer. The apparatus Includes an auto gain controller, an analog-to-digital converter and an auto-gain-control mapping circuit. The auto gain controller is used for receiving an incoming analog signal and amplifying the received analog signal. The analog-to-digital convertor is used for converting the output of the auto gain controller into a digital signal. The output of the auto-gain-control mapping circuit is used to control the gain of the auto gain controller. The equalizer is connected to the output of the analog-to-digital converter to eliminate signal attenuation in the digital output of the analog-to-digital converter. The output of the auto-gain-control mapping circuit controls the gain of the auto gain controller based on the primary weight of the equalizer.

11 Claims, 6 Drawing Sheets

APPARATUS AND METHOD FOR COMPENSATING SIGNAL ATTENUATION BASED ON AN EQUALIZER

BACKGROUND OF INVENTION

1. Field of the Invention

This invention relates to signal processing technology, and more particularly, to an apparatus and method for compensating signal attenuation based on an equalizer.

2. Description of Related Art

Signal transmission can be carried out through two kinds of channels: a cable channel or an air channel. In digital communication, channels can cause two kinds of degradation of transmission: signal attenuation and inter symbol interference (ISI). The former is from energy dispersed by the channel and the later is from bandwidth limitation of the channel. Sometimes, we use equalizers to overcome ISI and use auto-gain-control mechanism to compensate signal attenuation.

FIG. 1 is a schematic block diagram showing the architecture of a conventional apparatus for compensating signal attenuation. As shown, this apparatus includes a signal transmission channel 102 (which can be either a cable channel or an air channel), an auto gain controller 104, an A/D (analog-to-digital) converter 106, an equalizer 108, an accumulator 110, an averaging circuit 112, and an auto-gain-control mapping circuit 114. When an analog signal is transmitted through the signal transmission channel 102, it is subsequently amplified by the auto gain controller 104, and the amplified output is then transferred to the A/D converter 106 where it is converted into digital form. The output digital signal from the A/D converter 106 is then transferred both to the equalizer 108 and a feedback circuit consisting of the accumulator 110, the averaging circuit 112, and the auto-gain-control mapping circuit 114. The digital signal is first processed by the accumulator 110, and the output of the accumulator 110 is then processed by the averaging circuit 112. The output of the averaging circuit 112 is then transferred to the auto-gain-control mapping circuit 114 which is capable of outputting a gain value corresponding to the output value of the averaging circuit 112 and sending this gain value to the auto gain controller 104 to correspondingly adjust the gain of the auto gain controller 104. This feedback control continues until the equalizer 108 receives the desired digital signal amplitude.

One disadvantage of using the forgoing apparatus, however, is that the accumulator 110 needs a great amount of signal amplitude values to compute for the incoming signal amplitude, which is a time-consuming procedure, making the overall operation quite inefficient. Moreover, since the output digital signal from the A/D converter 106 would be ISI degraded, it would not allow the subsequent feedback circuit, including the accumulator 110, the averaging circuit 112, and the auto-gain-control mapping circuit 114, to obtain an accurate result to control the gain of the auto gain controller 104.

In conclusion, the conventional apparatus has the following drawbacks:

First, it would need storing a great amount of signal amplitude values to compute for the incoming signal amplitude, which is a time-consuming procedure, making the overall operation quite inefficient.

Second, since the signal would be subjected to ISI degradation, it would result in an inaccurate gain control.

Third, when the gain of the auto gain controller 104 comes to a fixed value, it would nevertheless requires the pre-evaluation of an initial weight value for the equalizer 108, which would not be easy to accurately carry out.

SUMMARY OF INVENTION

It is therefore an objective of this invention to provide an apparatus and method for compensating signal attenuation based on an equalizer, which can help eliminate the above-mentioned problems of the prior art.

In accordance with the foregoing and other objectives, the invention proposes a new apparatus and method for compensating signal attenuation based on an equalizer.

The apparatus according to the invention comprises an auto gain controller, an A/D converter, an equalizer, and an auto-gain-control mapping circuit. The auto gain controller is used for receiving an incoming analog signal and amplifying the received analog signal. The A/D converter is coupled to the auto gain controller for converting the output of the auto gain controller into a digital signal. The auto-gain-control mapping circuit is connected to the auto gain controller, whose output is used to control the gain of the auto gain controller and whose input is connected to a primary weight of the equalizer, wherein the primary weight is the largest one of the weights. The equalizer is connected to the output of the A/D converter, for compensating signal attenuation in the output digital signal from the A/D converter.

In one preferred embodiment of the invention, the output-to-input characteristic of the auto-gain-control mapping circuit is a monotonic increasing function.

In another preferred embodiment of the invention, the equalizer is an adaptive filter type.

The method according to the invention for compensating signal attenuation comprises adjusting for a gain based on a primary weight, amplifying an input signal by the gain, adjusting the weights (including the primary weight) and the input signal, performing a compensation action on the input signal based on the adjusted primary weight, judging whether the weights are sable, if yes, processing the input signal based on weights of the equalizer and the gain, if not, adjusting the gain again on the primary weight.

In the foregoing operation, the adjusting of the weight values (including the primary weight and other weights) is implemented by inputting a training signal.

The apparatus and method according to the invention is capable of compensating signal attenuation due to ISI degradation and allows the gain control to be more precise than the prior art.

BRIEF DESCRIPTION OF DRAWINGS

The invention can be more fully understood by reading the following detailed description of the preferred embodiments, with reference made to the accompanying drawings, wherein: drawingsdrawings FIG. 1 (PRIOR ART) is a schematic block diagram showing the architecture of a conventional apparatus for compensating signal attenuation.

DETAILED DESCRIPTION

The apparatus and method according to the invention for compensating signal attenuation based on a feed forward equalizer is disclosed in full detail by way of preferred embodiments in the following with reference to FIG. 2, FIG. 3, FIG. 4, and FIG. 5.

Figure 1:
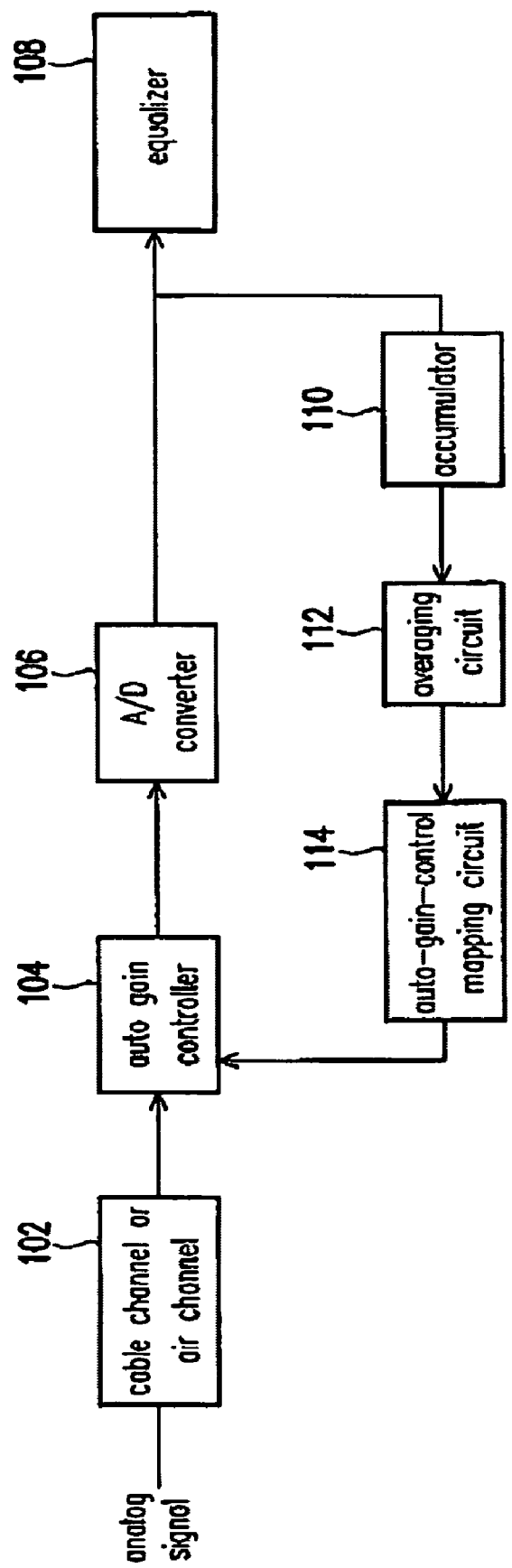
Figure 2:
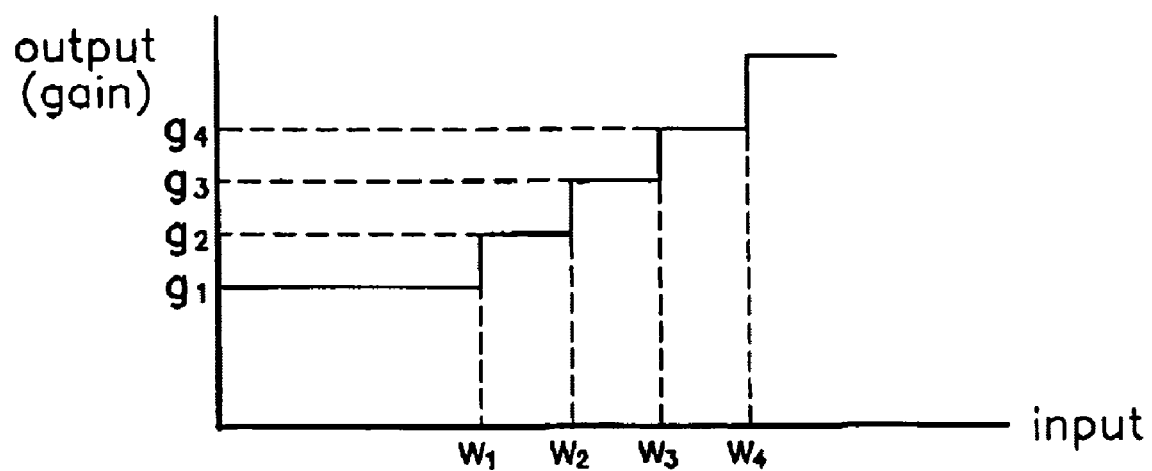
FIG. 2 is a schematic characteristics of an auto-gain-control mapping circuit used in the invention, which is a monotonic increasing function.

According to a preferred embodiment of the invention, output-to-input characteristics of an auto-gain-control mapping circuit used in the invention is a monotonic increasing function, which is shown in FIG. 2.

Figure 3:
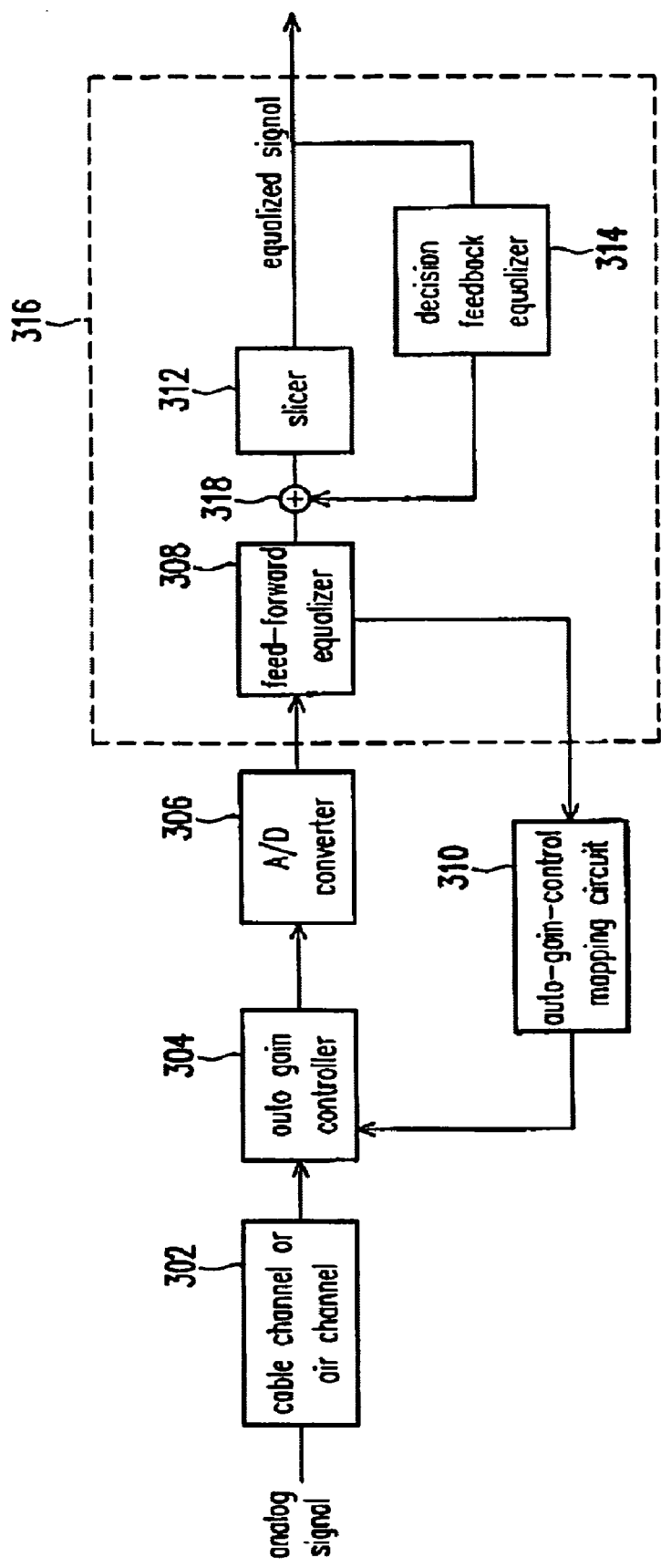
FIG. 3 is a schematic block diagram showing the architecture of a preferred embodiment of the apparatus according to the invention for compensating signal attenuation.

Referring to FIG. 3, which is a schematic block diagram showing the architecture of a preferred embodiment of the apparatus according to the invention for compensating signal attenuation. Please also referring to FIG. 4 for a flow diagram showing the procedural steps by the method of the invention for compensating signal attenuation. Herein is an algorithm explanation of the preferred embodiment of the invention. However, procedures performed in the embodiment can work simultaneously.

As shown in FIG. 3, the apparatus according to the invention is coupled to the output end of a signal transmission channel 302 (which can be either a cable channel or an air channel) and comprises an auto gain controller 304, an A/D (analog-to-digital) converter 306, a feed forward equalizer 308 (which is located in an equalizer 316), and an auto-gain-control mapping circuit 310.

The auto gain controller 304 is used to amplify the incoming analog signal transmitted through the signal transmission channel 302. The A/D converter 306 is connected to the auto gain controller 304 for converting the amplified output of the auto gain controller 304 into digital form. The auto-gain-control mapping circuit 310 is connected as a feedback circuit from the feed forward equalizer 308 to the auto gain controller 304. The output of the auto-gain-control mapping circuit 310 is used to control the gain of the auto gain controller 304. The equalizer 316 includes the feed forward equalizer 308, a slicer 312, a decision feedback equalizer 314 and an adder 318.

The feed forward equalizer 308 is connected to the A/D converter 306 for receiving the output of the A/D converter 306 and is capable of compensating the signal attenuation in the output digital signal. The output-to-input characteristic of the auto-gain-control mapping circuit 310 is preferably a monotonic increasing function. The feed forward equalizer 308 is preferably an adaptive filter of any type.

For example, when a signal is transmitted through a cable channel or an air channel, the signal will be degraded by inter symbol interference (ISI) caused by the neighboring transmitting signals. In digital communication, channels can cause two kinds of degradation of transmission: signal attenuation and inter symbol interference (ISI). The former is from energy dispersed by the channel and the later is from bandwidth limitation of the channel. That is the reason why equalizers are used to overcome ISI and an auto-gain-control mechanism is used to compensate signal attenuation.

Figure 4:
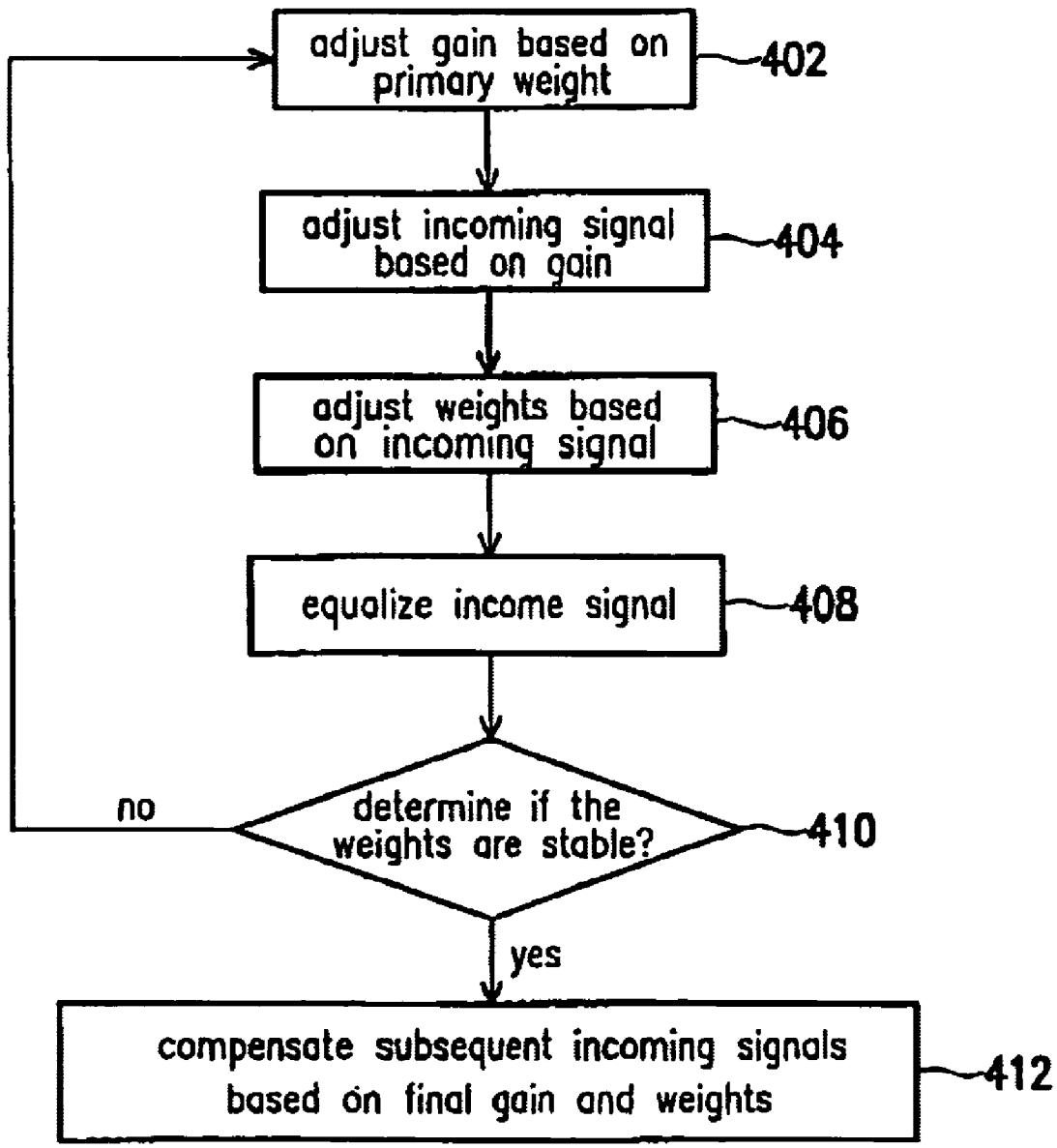
FIG. 4 is a flow diagram showing the procedural steps by the method of the invention for compensating signal attenuation.

Therefore, referring to FIG. 4, showing a flow chart for steps by the method of a preferred embodiment of the invention for compensating signal attenuation. Initially in the step 402, the gain of the auto gain controller 304 is adjusted by a primary weight value pre-assigned to the auto-gain-control mapping circuit 310 (the primary weight value is the largest one of several weight values) and the gain is then assigned to the input signal.

In the next step 404, the auto gain controller 304 then amplifies the signal by the gain set in step 402 so that the signal amplitude can be raised to a level within the acceptable input range of the A/D converter 306. The amplified signal is then converted by the A/D converter 306 into digital form. The digital output of the A/D converter 306 is then transferred to the feed forward equalizer 308.

In the next step 406, the feed forward equalizer 308 adjusts weight values for compensating the amplitude of the digitized signal (of course, the primary weight value is also adjusted because the primary weight value is the largest one of weight values of the feed forward equalizer 308), so as to allow the signal amplitude to be restored to its original level, on the other hand, the other weights are used to eliminated the ISI degradation of the sequentially received signals. In the next step 408, the auto-gain-control mapping circuit 310 automatically adjusts the gain of the auto gain controller 304 based on the primary weight value.

In the next step 410, it is determined whether the primary weight value is stable. If yes, the primary weight value used in the above-described steps will be continuously used for following transmitted signals, as stated in step 112. However, if the primary weight value is not stable, steps 402~408 are performed again till the primary weight value is determined stable.

When the next incoming signal is passing through the signal transmission channel 302, it would also be subjected to ISI. At this stage, this incoming signal will also be treated by the steps 402~408, as described above. First, the coming signal is amplified by the auto gain controller 304 using the newly-adjusted gain, so that the incoming signal amplitude can be raised to a level within the acceptable input range of the A/D converter 306. The amplified signal is then converted by the A/D converter 306 into digital form. The digital output of the A/D converter 306 is then transferred to the feed forward equalizer 308. The feed forward equalizer 308 adjusts for suitable primary weight value. The principle can be shortened as followed, with referring to FIGS. 5A and 5B. When the signal amplitude is large, what is desired is to decrease the gain and the primary weight will decrease to guarantee the output signal (before the slicer 312) maintaining constantly. When the primary weight decreases, the auto-gain control mapping circuit 310 will decrease the gain of the auto-gain controller 304, which is desired by the design. On the other hand, when the primary weight adjusts, other weights adjust, too. This means that we cancel the ISI degradation at the same time. Therefore, this device can calculate the signal power without ISI interference.

Figures 5A, 5B:
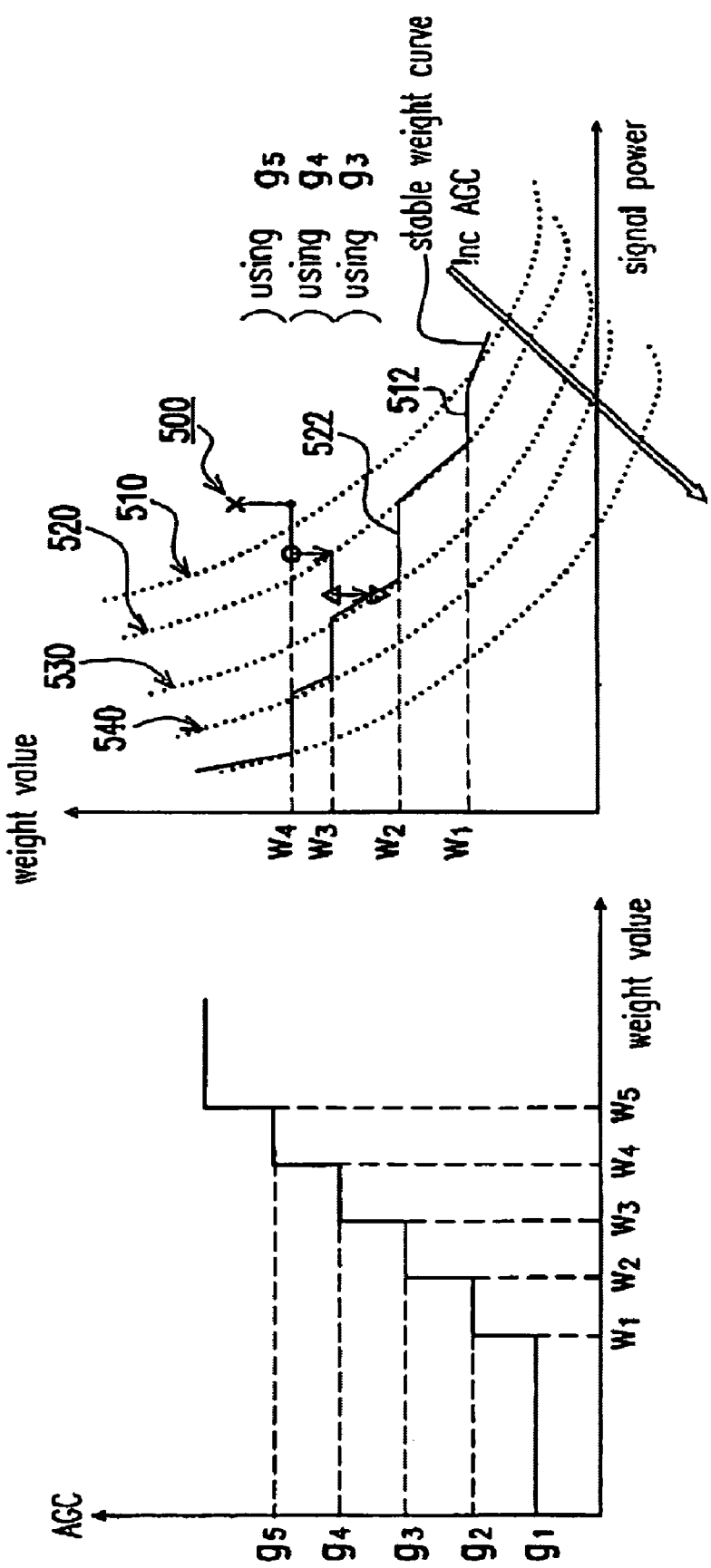
FIG. 5A is a diagram showing the relationship between the gain of the auto-gain controller and the value of the primary weight.
FIG. 5B is a diagram showing the relationship of the value of the primary weight and the signal power of the output signal of the equalizer.

As shown in FIG. 5A, the output-to-input characteristic of the auto-gain-control mapping circuit 310, which is the gain of the auto-gain controller ("AGC" as shown in drawing) to the primary weight value, is preferably a monotonic increasing function. In FIG. 5B, line 512 is called "stable weight curve", which is explained as followed. In general, AGC gain×Primary weight value×Signal power=Constant Therefore, for each primary weight region (for example, w3~w4 in FIG. 5B), its relative AGC gain value (for example, "g4" in FIG. 5B) is known, and thus:

Stable Primary weight=Contant/(AGC gain×Signal Power)

For each weight region, we can plot the relative curves (dash lines 510, 520, 530 and 540 in FIG. 5B. We can join all curves of each section to find a final stable primary weight. For example, the solid line 512 as shown in FIG. 5B is the final result we need. For each of the input signals, its relative weight wills coverage to the solid line 512, therefore, it is called "stable weight curve."

As shown in FIG. 5A, the output-to-input characteristic of the auto-gain-control mapping circuit 310, which is the gain of the auto-gain controller ("AGC" as shown in drawing) to the primary weight value, is preferably a monotonic increasing function. As shown in FIG. 5B, dash lines 510, 520, 530 and 540 represent fixed gain values for the auto-gain controller in different cases. When the signal amplitude is large, the primary weight will decrease to maintain the output signal a constant. When the primary weight decreases, the auto-gain control mapping circuit will decrease the gain of the auto-gain controller. As shown in FIGS. 5A and 5B, from dash line 510 to dash line 520 through line 512, the gain of the auto-gain controller is increased from g1 to g2 to maintain the signal power of the output signal to the constant. If the signal amplitude becomes smaller than desired, the fixed weight value will be changed from dash line 520 to dash line 530 through line 522. That is, from dash line 520 to dash line 530 through line 522, the gain of the auto-gain controller is increased from g2 to g3 to maintain the signal power of the output signal. As shown in FIG. 5B, if an input signal 500 is received, the main weight will decrease. After it decreases, then w4, the auto-gain-control mapping circuit will map gain from g5 to 94. Therefore, the input signal power is decreased. The procedure will go on until main weight and AGC reach the "stable weight curve".

Figure 6:
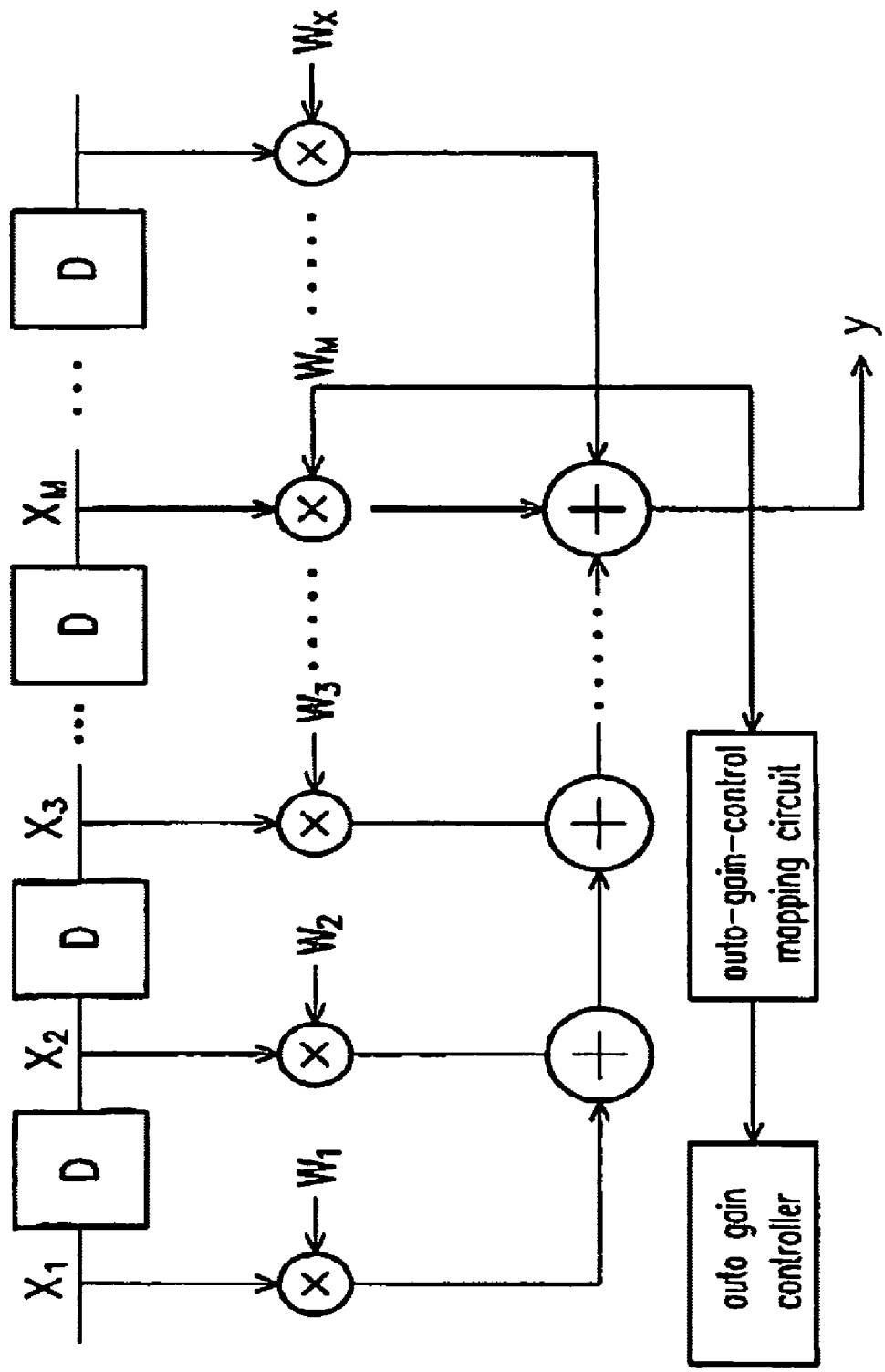
FIG. 6 is a schematic diagram showing the signal processing algorithm used by the feed forward equalizer utilized by the invention.

FIG. 6 is a schematic diagram showing the signal processing algorithm used by the feed forward equalizer 308. This algorithm can be realized by using adaptive filters. The mathematical equation for the signal compensation performed by the feed forward equalizer 308 can be expressed as follows: $y=x_1*W_1+x_2*W_2+x_3*W_3+ \ldots +x_M*W_M+ \ldots +x_X*W_X$ where $x_M$ is the digital output of the A/D converter 306, which will be equalized;

$x_i$ i≠m is an interference signal neighboring the $x_M$ signal; and $W_i$ i=1~x, is the weight assigned to Di, as shown in FIG. 5, Di is an unit delay circuit.

The foregoing equation can be implemented through a plurality of adders and averaging circuits which are schematically illustrated in FIG. 6.

Further, the apparatus according to the invention for compensating signal attenuation further comprises a slicer 312 and a decision feedback equalizer 314, wherein the slicer 312 is coupled to the output of the feed forward equalizer 308 for maintaining the output power of the feed forward equalizer 308 at a constant level, and the decision feedback equalizer 314 is connected from the output of the slicer 312 to the output of the feed forward equalizer 308

In conclusion, the invention provides an apparatus and method for compensating signal attenuation, which is based on a feed forward equalizer 308 for compensating signal attenuation due to ISI degradation. When the incoming signal is small in amplitude, the invention can adjust for greater weight values so as to maintain the signal amplitude at the desired level. The auto-gain-control mapping circuit 310 is capable of adjusting the gain of the auto gain controller 304 to a suitable value according to the newly-adjusted primary weight value.

Since the output-to-input characteristic of the auto-gain-control mapping circuit 310 is a monotonic increasing function, as in FIG. 2 which shows that $g_i>g_j$ if $w_i>w_j$, the gain of the auto gain controller 304 would increase with the primary weight value until the output signal reaches a stable state. On the other hand, when the incoming signal is overly large in amplitude, the invention is also capable of making it stabilize at the desired level. The weight values for these equalizers can be performed by common ways, such as least-mean-square (LMS) or recursive-least-square (RLS).

In addition, the slicer 312 is used in the equalizer 316 for judging a level of output from the feed forward equalizer 308. The output of the decision feedback equalizer 314 coupled to the adder 318 is added by the output of the feed forward equalizer 308 and is then input to the slicer 312.

Furthermore, the preferred embodiment of the invention is also suitable for a equalization system with train signals, or for a blind equalization system without train signals.

Compared to the prior art, the invention has the following advantages: First, the invention can be implemented without the need of a great amount of digital data for computing the incoming signal amplitude, which makes the overall operation more efficient than the prior art.

Second, the use of the equalizer for compensating signal attenuation due to ISI degradation allows the overall gain control to be more precise than the prior art.

Third, the invention needs no pre-evaluation of the initial weight values when the gain of the auto gain controller 304 is determined, which makes the implementation of the invention more efficient than the prior art.

Fourth, the invention requires no use of an adder and averaging circuit in the feedback circuit, which allows the circuit architecture to be less complex and thus more cost-effective to implement.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. An apparatus for compensating signal attenuation based on an equalizer, the equalizer having a feed forward equalizer, the feed forward equalizer having a plurality of weights, the largest weight of the weights being a primary weight, the apparatus comprises:

an auto gain controller, for receiving an incoming analog signal and amplifying the received analog signal;

an analog-to-digital converter, connected to the auto gain controller, for con-verting the output of the auto gain controller into a digital signal; and an auto-gain-control mapping circuit connected to the auto gain controller, whose output is used to control the gain of the auto gain controller, wherein the equalizer being connected to the output of the analog-to-digital converter, for eliminating signal attenuation in the digital output of the analog-to-digital converter, the primary weight of the feed forward equalizer being transmitted to the auto-gain-control mapping circuit the output of the auto-gain-control mapping circuit controlling the gain of the auto gain controller based only on the primary weight.

2. The apparatus of claim 1, wherein the output-to-input characteristic of the auto-gain-control mapping circuit is a monotonic increasing function.

3. The apparatus of claim 1, wherein the equalizer is an adaptive filter type.

4. An apparatus for compensating signal attenuation, comprises:
   an auto gain controller, for receiving an incoming analog signal and amplifying the received analog signal;
   an analog-to-digital converter, connected to the auto gain controller, for con-verting the output of the auto gain controller into a digital signal;
   an auto-gain-control mapping circuit connected to the auto gain controller, whose output is used to control the gain of the auto gain controller; and
   an equalizer, connected to the output of the analog-to-digital converter, for eliminating signal attenuation in the digital output of the analog-to-digital converter, the equalizer having a feed forward equalizer with a plurality of weights, a primary weight of the feed forward equalizer is a largest weight of the weights, the primary weight being transmitted to the auto-gain-control mapping circuit, the output of the auto-gain-control mapping circuit controlling the gain of the auto gain controller based only on the primary weight.

5. The apparatus of claim 4, wherein the output-to-input characteristic of the auto-gain-control mapping circuit is a monotonic increasing function.

6. The apparatus of claim 4, wherein the equalizer is an adaptive filter type.

7. A method for compensating signal attenuation based on an equalizer, comprising the steps of:
   adjusting for a gain based only on a primary weight value;
   amplifying an incoming signal by the gain;
   adjusting weights of the equalizer including the primary weight value;
   performing a compensation action on the incoming signal based on the adjusted primary weight; and
   judging whether the compensation action eliminates ISI in the incoming signal,
      if YES, processing the incoming signal based on the adjusted primary weight value, and the gain;
      if NOT, returning to the step of adjusting the gain based on the primary weight value.

8. The method of claim 7, wherein the output-to-input characteristic of the primary weight and the gain is a monotonic increasing function.

9. The method of claim 7, wherein the primary weight value is adjusted by using a train signal.

10. The apparatus of claim 1, further comprising:
    a slicer, coupled to the output of the feed forward equalizer, for maintaining the output power of the feed forward equalizer at a constant level; and
    a decision feedback equalizer, coupled from the output of the slicer to the output of the feed forward equalizer.

11. The apparatus of claim 4, further comprising:
    a slicer, coupled to the output of the feed forward equalizer, for maintaining the output power of the feed forward equalizer at a constant level; and
    a feed-backward equalizer, coupled from the output of the slicer to the output of the feed forward equalizer.

* * * * *